(12) United States Patent
Park et al.

(10) Patent No.: US 10,453,944 B2
(45) Date of Patent: Oct. 22, 2019

(54) OXIDE THIN FILM TRANSISTOR, METHOD OF MANUFACTURING THE SAME, AND DISPLAY PANEL AND DISPLAY DEVICE INCLUDING THE OXIDE THIN FILM TRANSISTOR

(71) Applicant: LG Display Co., Ltd., Seoul (KR)

(72) Inventors: Jaeyoon Park, Bucheon-si (KR); SeHee Park, Paju-si (KR); HyungJoon Koo, Bucheon-si (KR); Kwanghwan Ji, Bucheon-si (KR); PilSang Yun, Bucheon-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/858,065

(22) Filed: Dec. 29, 2017

(65) Prior Publication Data

US 2018/0190798 A1 Jul. 5, 2018

(30) Foreign Application Priority Data

Dec. 30, 2016 (KR) ........................ 10-2016-0184468

(51) Int. Cl.
*H01L 29/66* (2006.01)
*H01L 29/786* (2006.01)
(Continued)

(52) U.S. Cl.
CPC .. *H01L 29/66969* (2013.01); *H01L 21/02483* (2013.01); *H01L 21/02491* (2013.01);
(Continued)

(58) Field of Classification Search
CPC combination set(s) only.
See application file for complete search history.

(56) References Cited

U.S. PATENT DOCUMENTS 9,285,913 B1* 3/2016 Kang .................... G06F 3/0412
2005/0001211 A1* 1/2005 Yamazaki ........... G02F 1/13452
257/52
(Continued)

FOREIGN PATENT DOCUMENTS

| JP | 2011-146694 A | 7/2011 |
| JP | 2012-256871 A | 12/2012 |
| JP | 2016-184771 A | 10/2016 |

OTHER PUBLICATIONS

Hu et al.; Ultra-High Field-Effect Mobility Thin-Film Transistors with MOCVD Grown In-2-O-3 Channel Treated by Oxygen Microwave Plasma; IEEE Electron Device Letters; DOI 10.1109/LED.2015.2476507.

(Continued)

*Primary Examiner* — Mamadou L Diallo
(74) *Attorney, Agent, or Firm* — Polsinelli PC

(57) ABSTRACT

Disclosed are an oxide thin film transistor (TFT), a method of manufacturing the same, a display panel including the oxide TFT, and a display device including the display panel, in which a crystalline oxide semiconductor is provided on a metal insulation layer including metal through a metal organic chemical vapor deposition (MOCVD) process. The oxide TFT includes a metal insulation layer including metal, a crystalline oxide semiconductor adjacent to the metal insulation layer, a gate including metal, a gate insulation layer between the crystalline oxide semiconductor and the gate, a first conductor in one end of the crystalline oxide semiconductor, and a second conductor in another end of the crystalline oxide semiconductor.

17 Claims, 5 Drawing Sheets

(51) Int. Cl.
    *H01L 27/12* (2006.01)
    *H01L 29/04* (2006.01)
    *H01L 21/02* (2006.01)

(52) U.S. Cl.
    CPC .. *H01L 21/02502* (2013.01); *H01L 21/02565* (2013.01); *H01L 21/02609* (2013.01); *H01L 21/02672* (2013.01); *H01L 27/1225* (2013.01); *H01L 29/045* (2013.01); *H01L 29/7869* (2013.01); *H01L 29/78603* (2013.01); *H01L 21/0262* (2013.01)

(56) References Cited

U.S. PATENT DOCUMENTS

| | | | | |
|---|---|---|---|---|
| 2010/0304528 | A1* | 12/2010 | Kim | H01L 21/02554 438/104 |
| 2011/0147738 | A1 | 6/2011 | Yamazaki et al. | |
| 2012/0276694 | A1* | 11/2012 | Koezuka | H01L 29/7869 438/151 |
| 2014/0034946 | A1 | 2/2014 | Yamazaki et al. | |
| 2014/0084282 | A1* | 3/2014 | Cao | H01L 29/7869 257/43 |
| 2014/0131696 | A1* | 5/2014 | Ono | H01L 29/7869 257/40 |
| 2016/0163865 | A1* | 6/2016 | Nakayama | H01L 21/02565 257/43 |
| 2016/0247940 | A1* | 8/2016 | Li | H01L 21/77 |
| 2017/0104089 | A1* | 4/2017 | Koezuka | H01L 21/0217 |
| 2018/0197959 | A1* | 7/2018 | Fujita | H01L 21/28 |
| 2018/0197973 | A1* | 7/2018 | Deng | H01L 29/66969 |
| 2018/0286341 | A1* | 10/2018 | Nagasaka | G09G 3/20 |

OTHER PUBLICATIONS

Mane et al., Indium Oxide Thin Films by Atomic Layer Deposition Using Trimethylindium and Ozone; The Journal of Physical Chemistry; Apr. 18, 2016; J. Phys. Chem. C 2016, 120, 9874-9883; DOI: 10.1021/acs.jpcc.6b02657.

Office Action dated Dec. 20, 2018 issued in the corresponding Japanese Patent Application No. 2017-247829, pp. 1-2.

Office action dated Sep. 3, 2019 issued in a corresponding Japanese Patent application No. 2017-247829 (5 pages) and English language translation (5 pages).

* cited by examiner

OXIDE THIN FILM TRANSISTOR, METHOD OF MANUFACTURING THE SAME, AND DISPLAY PANEL AND DISPLAY DEVICE INCLUDING THE OXIDE THIN FILM TRANSISTOR

CROSS-REFERENCE TO RELATED APPLICATION

This application claims the benefit of the Korean Patent Application No. 10-2016-0184468 filed on Dec. 30, 2016, which is hereby incorporated by reference.

BACKGROUND

Field of the Disclosure

The present disclosure relates to a display device, and more particularly, to an oxide thin film transistor (TFT), a method of manufacturing the same, a display panel including the oxide TFT, and a display device including the display panel.

Description of the Background

Flat panel display (FPD) devices are applied to various kinds of electronic products such as portable phones, tablet personal computers (PCs), notebook PCs, etc. Examples of the FPD devices include liquid crystal display (LCD) devices, organic light emitting display devices, etc. Recently, electrophoretic display devices (EPDs) are being widely used as a type of FPD device.

In the FPD devices (hereinafter referred to as a display device), the LCD devices display an image by using liquid crystals, and the organic light emitting display devices use a self-emitting device which self-emits light.

A display panel constituting a display device includes a plurality of switching elements for displaying an image. Each of the switching elements includes a TFT. The TFT is formed of amorphous silicon, polysilicon, or an oxide semiconductor. A TFT including the oxide semiconductor is referred to as an oxide TFT.

The oxide TFT is manufactured through a sputtering process.

Particularly, an amorphous oxide TFT is formed through a low temperature film forming process using the sputtering process. In order to manufacture a crystalline oxide TFT, for example, a high temperature film forming process is performed at a temperature of 300 degrees C. or higher, and then, a thermal treatment is additionally performed.

Since the amorphous oxide TFT and the crystalline oxide TFT have different characteristics, the amorphous oxide TFT and the crystalline oxide TFT are individually applied to various fields. Particularly, since the crystalline oxide TFT is good in reliability, the use of the crystalline oxide TFT is increasing.

However, as described above, the high temperature film forming process should be performed for manufacturing the related art crystalline oxide TFT. However, it is difficult for the high temperature film forming process to be applied to a display panel including a large screen.

Moreover, since a thermal treatment process should be performed after the high temperature film forming process, a process becomes complicated.

Moreover, in a case of performing the related art high temperature film forming process and the thermal treatment, a crystal direction cannot be set as desired.

SUMMARY

Accordingly, the present disclosure is directed to provide an oxide TFT, a method of manufacturing the same, a display panel including the oxide TFT, and a display device including the display panel that substantially obviate one or more problems due to limitations and disadvantages of the related art.

An aspect of the present disclosure is directed to provide an oxide TFT, a method of manufacturing the same, a display panel including the oxide TFT, and a display device including the display panel, in which a crystalline oxide semiconductor is provided on a metal insulation layer including metal through a metal organic chemical vapor deposition (MOCVD) process.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an oxide TFT including a metal insulation layer including metal, a crystalline oxide semiconductor adjacent to the metal insulation layer, a gate including metal, a gate insulation layer between the crystalline oxide semiconductor and the gate, a first conductor in one end of the crystalline oxide semiconductor, and a second conductor in another end of the crystalline oxide semiconductor.

In another aspect of the present disclosure, there is provided an oxide TFT including a metal insulation layer including metal, a crystalline oxide semiconductor on the metal insulation layer, a gate insulation layer on the crystalline oxide semiconductor, a gate on the gate insulation layer, a first conductor in one end of the crystalline oxide semiconductor, and a second conductor in another end of the crystalline oxide semiconductor.

In another aspect of the present disclosure, there is provided an oxide TFT including a gate on a substrate, a gate insulation layer covering the gate, a crystalline oxide semiconductor on the gate insulation layer, a metal insulation layer on the crystalline oxide semiconductor and including metal, a first conductor on one side of the crystalline oxide semiconductor, and a second conductor on another side of the crystalline oxide semiconductor.

In another aspect of the present disclosure, there is provided a method of manufacturing an oxide TFT including depositing metal and an oxide semiconductor, applying heat to the metal and the oxide semiconductor having a non-crystalline structure to change the oxide semiconductor to a crystalline oxide semiconductor, and connecting a first electrode and a second electrode to the crystalline oxide semiconductor.

The depositing of the metal and the oxide semiconductor may include depositing the metal on a substrate and depositing the oxide semiconductor on the metal through an MOCVD process, and the connecting of the first electrode and the second electrode may include depositing a gate insulation layer material on the crystalline oxide semiconductor, depositing a gate material on the gate insulation layer material, etching the gate insulation layer material and the gate material to form a gate insulation layer and a gate, depositing an insulation layer to cover the gate insulation layer and the gate, forming a first contact hole exposing a first conductor provided in one end of the crystalline oxide semiconductor and a second contact hole exposing a second conductor provided in another end of the crystalline oxide semiconductor, in the insulation layer, and forming the first electrode connected to the first conductor through the first contact hole and the second electrode connected to the second conductor through the second contact hole, on the insulation layer.

The depositing of the metal and the oxide semiconductor may include depositing a gate on a substrate, depositing a gate insulation layer to cover the gate, depositing the oxide semiconductor on the metal on the gate insulation layer through an MOCVD process, and depositing the metal on the oxide semiconductor, and the connecting of the first electrode and the second electrode may include connecting the first electrode to a first conductor provided on one side of the crystalline oxide semiconductor and connecting the second electrode to a second conductor provided on another side of the crystalline oxide semiconductor.

In another aspect of the present disclosure, there is provided a display panel including a plurality of gate lines supplied with a gate pulse, a plurality of data lines respectively supplied with data voltages, and a plurality of pixels defined by intersections of the plurality of gate lines and the plurality of data lines, wherein the plurality of pixels each include at least one the oxide TFT.

In another aspect of the present disclosure, there is provided a display device including the display panel, a gate driver supplying a gate pulse to the plurality of gate lines included in the display panel, a data driver supplying data voltages to the plurality of data lines included in the display panel, and a controller controlling the gate driver and the data driver.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings.

DETAILED DESCRIPTION

Figure 1:
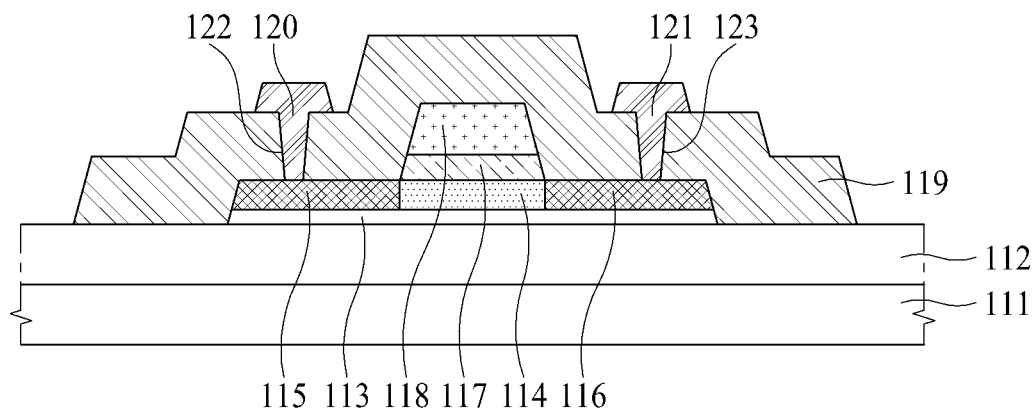
FIG. 1 is a cross-sectional view of an oxide TFT according to an aspect of the present disclosure.

Reference will now be made in detail to the exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Furthermore, the present disclosure is only defined by scopes of claims.

In the specification, in adding reference numerals for elements in each drawing, it should be noted that like reference numerals already used to denote like elements in other drawings are used for elements wherever possible.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various aspects of the present disclosure may be partially or overall coupled to or combined with each other, and may be variously inter-operated with each other and may be driven technically as those skilled in the art can sufficiently understand. The aspects of the present disclosure may be carried out independently from each other, or may be carried out together in co-dependent relationship.

Hereinafter, aspects of the present disclosure will be described in detail with reference to the accompanying drawings.

FIG. 1 is a cross-sectional view of an oxide TFT according to an aspect of the present disclosure.

The oxide TFT according to an aspect of the present disclosure, as illustrated in FIG. 1, may include a metal insulation layer 113 including metal, a crystalline oxide semiconductor 114 on the metal insulation layer 113, a gate 118 including metal, a gate insulation layer 117 provided between the crystalline oxide semiconductor 114 and the gate 118, a first conductor 115 provided in one end of the crystalline oxide semiconductor 114, and a second conductor 116 provided in the other end of the crystalline oxide semiconductor 114.

More specifically, the oxide TFT according to an aspect of the present disclosure illustrated in FIG. 1 may include a substrate 111, a buffer 112 provided on the substrate 111, the metal insulation layer 113 which is provided on the buffer 112 and includes metal, the crystalline oxide semiconductor 114 provided on the metal insulation layer 113, the gate insulation layer 117 provided on the crystalline oxide semiconductor 114, the gate 118 provided on the gate insulation layer 117, the first conductor 115 provided in the one end of the crystalline oxide semiconductor 114, the second conductor 116 provided in the other end of the crystalline oxide semiconductor 114, an insulation layer 119 which covers the gate insulation layer 117, the gate 118, the first conductor 115, the second conductor 116, and the buffer 112, a first electrode 120 which is provided on the insulation layer 119 and is connected to the first conductor 115 through a first contact hole 122 provided in the insulation layer 199, and a second electrode 121 which is provided on the insulation layer 119 and is connected to the second conductor 116 through a second contact hole 123 provided in the insulation layer 199.

The substrate 111 may be a glass substrate, a plastic substrate, or the like.

The buffer 112 may be an inorganic layer or an organic layer. The buffer 112 may be omitted.

The metal insulation layer 113 may include metal (for example, at least one of aluminum (Al), titanium (Ti), chromium (Cr), nickel (Ni), and a Mo—Ti alloy (MoTi)) having a metal reactivity which is lower than a metal reactivity of magnesium (Mg) and is higher than a metal reactivity of plumbum (Pb).

The crystalline oxide semiconductor 114 may include, for example, at least one of InGaZnO (IGZO), InZnO (IZO), InGaO (IGO), and InO which each including indium (In), gallium (Ga), zinc (Zn), and oxygen (O). The crystalline oxide semiconductor 114 may include more indium (In), and thus, may have a high mobility.

The crystalline oxide semiconductor 114 may be aligned in a direction parallel to a planar surface of the metal insulation layer 113. That is, the crystalline oxide semiconductor 114 may be aligned in one direction to have directionality. For example, the crystalline oxide semiconductor 114 may be aligned along the C-axis.

For example, an amorphous oxide semiconductor may be formed by depositing In, Ga, and Zn on metal through an MOCVD process.

When heat is applied to the amorphous oxide semiconductor, an oxidation-reduction reaction may be performed between the amorphous oxide semiconductor and the metal. Therefore, the metal may be changed to the metal insulation layer 113, which is a nonconductor. Also, the amorphous oxide semiconductor may be aligned to have certain directionality from a surface of the metal insulation layer 113, and thus, the crystalline oxide semiconductor 114 having directionality may be formed.

That is, in an aspect of the present disclosure, the crystalline oxide semiconductor 114 may be formed to have directionality corresponding to a desired direction by using an MOCVD process. Subsequently, In, Ga, Zn, and O may be deposited by using the crystalline oxide semiconductor 114 as a seed, and thus, a height of the crystalline oxide semiconductor 114 may increase. To provide an additional description, in an aspect of the present disclosure, the crystalline oxide semiconductor 114 having a controlled crystal direction may be formed through the MOCVD process.

The crystalline oxide semiconductor 114 having directionality has a high mobility and a high reliability.

For example, in IGZO-based oxide semiconductors, a defect state is reduced in the C-axis-aligned crystalline layer, and reliability and mobility based on in-plane carrier transport are enhanced. That is, crystals having certain directionality may be formed in the crystalline oxide semiconductor 114, and thus, the mobility and reliability of the crystalline oxide semiconductor 114 are improved.

Particularly, in an aspect of the present disclosure, metal such as Ti or MoTi strongly reacting with oxygen may be used for forming the crystalline oxide semiconductor 114 having a controlled crystal direction. As described above, the metal may be changed to the metal insulation layer 113 through the thermal treatment process.

The gate insulation layer 117 and the gate 118 may be formed of the same material as that of a gate insulation layer applied to a general oxide semiconductor.

In an etching process of forming the gate insulation layer 117 and the gate 118, the crystalline oxide semiconductor 114 may be exposed to plasma and/or the like, and thus, the one end and the other end of the crystalline oxide semiconductor 114 may become conductive. Therefore, the first conductor 115 and the second conductor 116 may be formed.

The insulation layer 119 may cover the gate insulation layer 117, the gate 118, the first conductor 115, the second conductor 116, and the buffer 112.

The first electrode 120 may be provided on the insulation layer 119 and may be connected to the first conductor 115 through the first contact hole 122 provided in the insulation layer 119.

The second electrode 121 may be provided on the insulation layer 119 and may be connected to the second conductor 115 through the second contact hole 123 provided in the insulation layer 119.

Figure 2:
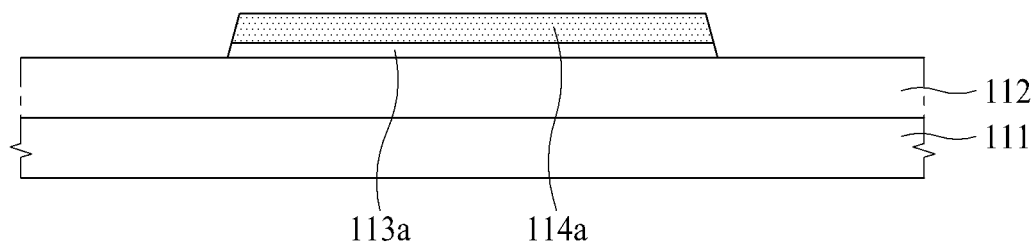
FIGS. 2 to 4 are exemplary diagrams illustrating a method of manufacturing the oxide TFT illustrated in FIG. 1.
Figure 3:
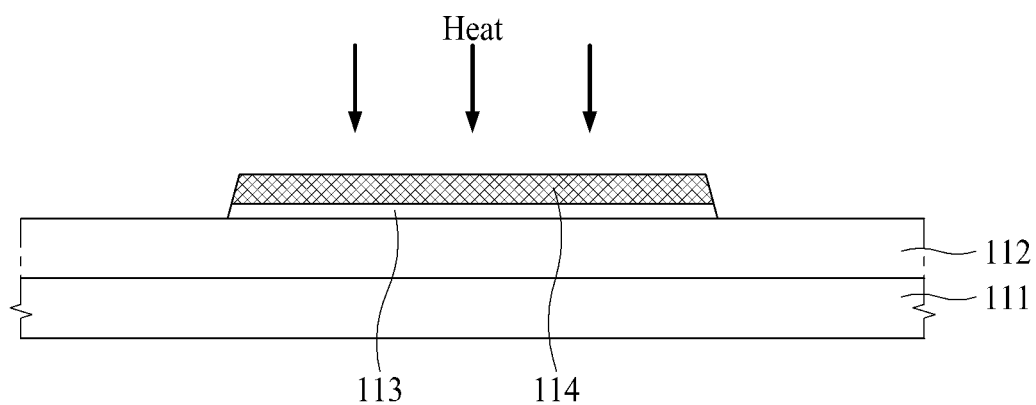
Figure 4:
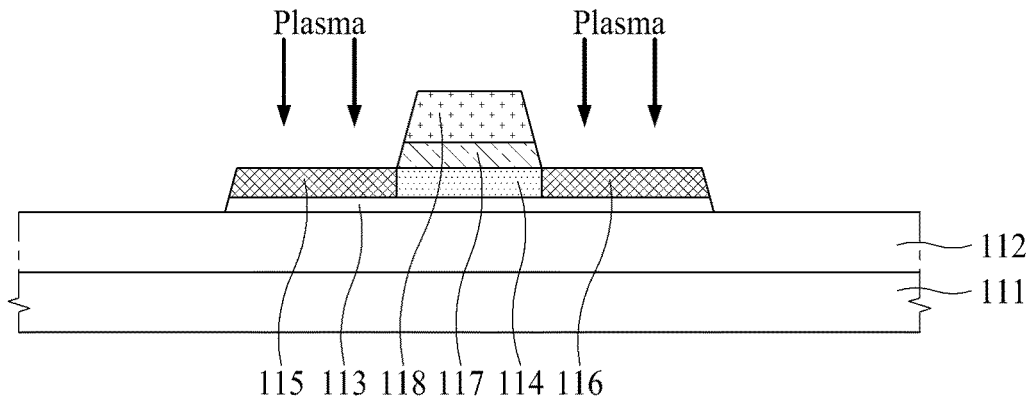

FIGS. 2 to 4 are exemplary diagrams illustrating a method of manufacturing the oxide TFT illustrated in FIG. 1. In the following description, details which are the same as or similar to details described above with reference to FIG. 1 are omitted or will be briefly described.

First, as illustrated in FIG. 2, the buffer 112 may be provided on the substrate 111, and a metal 113a may be provided on the buffer 112.

The metal 113a may be at least one of aluminum (Al), titanium (Ti), chromium (Cr), nickel (Ni), and a Mo—Ti alloy (MoTi). Particularly, the metal 113a may use Ti or MoTi having a strong bonding force to oxygen.

The metal 113a may be formed by a sputtering process.

Subsequently, as illustrated in FIG. 2, an amorphous oxide semiconductor 114a may be formed on the metal 113a through an MOCVD process.

The amorphous oxide semiconductor 114a may include, for example, at least one of InGaZnO (IGZO), InZnO (IZO), InGaO (IGO), and InO which each including indium (In), gallium (Ga), zinc (Zn), and oxygen (O).

Subsequently, as illustrated in FIG. 3, heat may be applied to the amorphous oxide semiconductor 114a and the metal 113a. Due to the heat, an oxidation-reduction reaction may be performed between the amorphous oxide semiconductor 114a and the metal 113a.

Due to the oxidation-reduction reaction, the metal 113a may be changed to the metal insulation layer 113, and the amorphous oxide semiconductor 114a may be changed to the crystalline oxide semiconductor 114 having directionality corresponding to one direction (for example, a direction parallel to a surface of the metal insulation layer 113).

That is, in an aspect of the present disclosure, the crystalline oxide semiconductor 114 may be formed on the metal insulation layer 113 to have directionality corresponding to a desired direction by using an MOCVD process and a thermal treatment process. Subsequently, In, Ga, Zn, and O may be further deposited on the crystalline oxide semiconductor 114 through the MOCVD process by using the crystalline oxide semiconductor 114 as a seed, and thus, a height of the crystalline oxide semiconductor 114 may increase.

Particularly, in an aspect of the present disclosure, by using a reaction of the metal 113a with oxygen, the crystalline oxide semiconductor 114 may be aligned and formed in a specific direction.

Moreover, a crystal direction of the crystalline oxide semiconductor 114 may be controlled by the MOCVD process.

Subsequently, a gate insulation layer material may be deposited on the crystalline oxide semiconductor 114.

Subsequently, a gate material may be deposited on the gate insulation layer material.

Subsequently, by etching the gate insulation layer material and the gate material, as illustrated in FIG. 4, the gate insulation layer 117 and the gate 118 may be formed.

In the etching process of forming the gate insulation layer 117 and the gate 118, a region of the crystalline oxide semiconductor 114 uncovered by the gate insulation layer 117 and the gate 118 may be exposed to plasma and/or the like, and thus, may become conductive. Therefore, as illustrated in FIG. 4, the first conductor 115 may be formed in the one end of the crystalline oxide semiconductor 114, and the second conductor 116 may be formed in the other end of the crystalline oxide semiconductor 114.

Subsequently, the insulation layer 119 may be deposited to cover the gate insulation layer 117 and the gate 118.

Subsequently, the first contact hole 122 exposing the first conductor 115 provided in the one end of the crystalline oxide semiconductor 114 and the second contact hole 123 exposing the second conductor 116 provided in the other end of the crystalline oxide semiconductor 114 may be formed in the insulation layer 119.

Finally, the first electrode 120 connected to the first conductor 115 through the first contact hole 122 and the second electrode 121 connected to the second conductor 116 through the second contact hole 123 may be formed on the insulation layer 119. Therefore, the oxide TFT according to an aspect of the present disclosure illustrated in FIG. 1 may be manufactured.

That is, through the above-described processes, an oxide TFT including the crystalline oxide semiconductor 114 having a thickness of 150 Å or less may be manufactured. A structure illustrated in FIG. 1 may be referred to as a coplanar structure.

Figure 5:
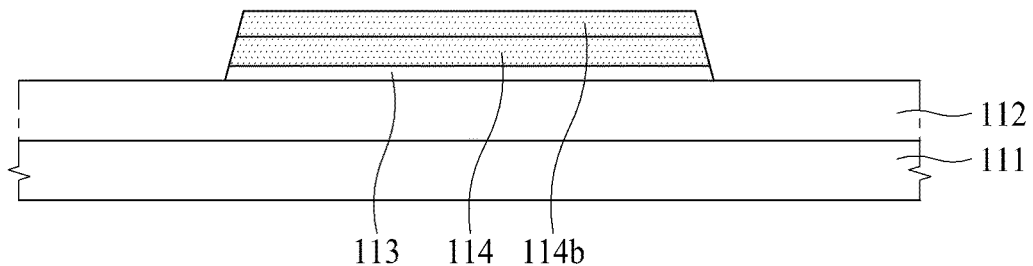
FIGS. 5 to 7 are other exemplary diagrams illustrating a method of manufacturing an oxide TFT according to an aspect of the present disclosure.
Figure 6:
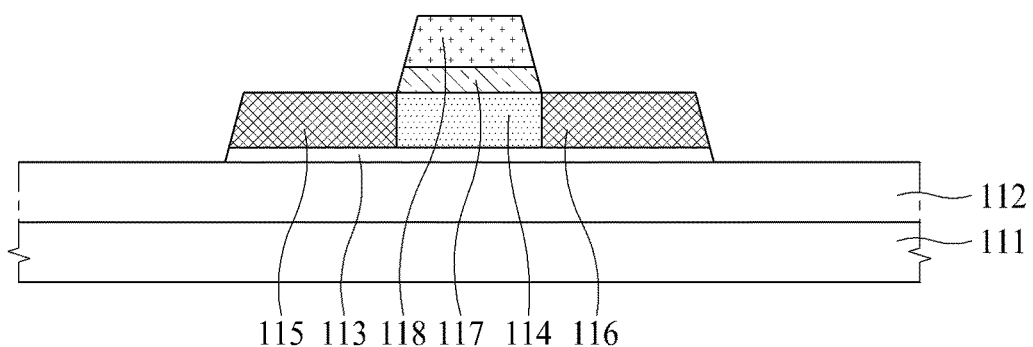
Figure 7:
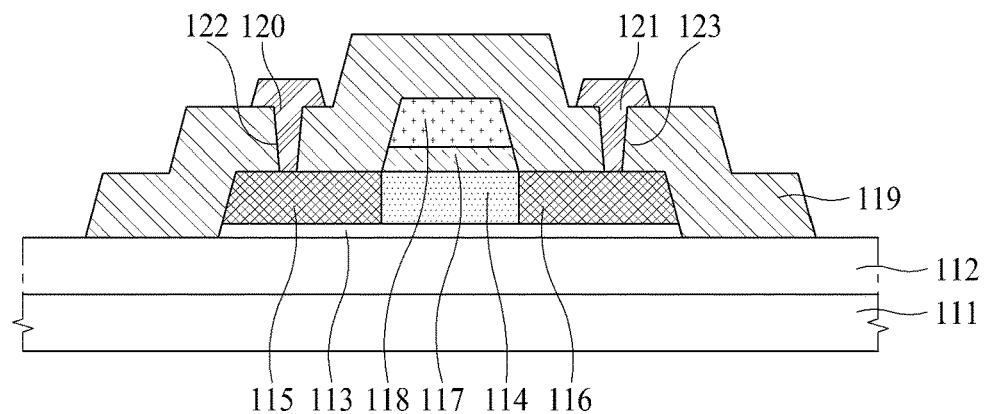

FIGS. 5 to 7 are other exemplary diagrams illustrating a method of manufacturing an oxide TFT according to an aspect of the present disclosure. In the following description, details which are the same as or similar to details described above with reference to FIGS. 1 to 4 are omitted or will be briefly described.

First, through the processes described above with reference to FIGS. 2 to 4, the buffer 112, the metal insulation layer 113, and the crystalline oxide semiconductor 114 may be formed on the substrate 111.

Subsequently, as illustrated in FIG. 5, another crystalline oxide semiconductor 114b may be formed on the crystalline oxide semiconductor 114 by using the crystalline oxide semiconductor 114 as a seed.

The crystalline oxide semiconductor 114b may be formed on the crystalline oxide semiconductor 114 through the MOCVD process, and in this case, the crystalline oxide semiconductor 114 may be used as a seed.

That is, In, Ga, Zn, and O may be further deposited on the crystalline oxide semiconductor 114 through the MOCVD process by using the crystalline oxide semiconductor 114 as a seed, and thus, a height of the crystalline oxide semiconductor 114 may increase.

Therefore, the crystalline oxide semiconductor 114b may have the same crystalline and directionality as those of the crystalline oxide semiconductor 114. Accordingly, the crystalline oxide semiconductor 114 cannot be clearly differentiated from the crystalline oxide semiconductor 114b substantially.

Through the process, the height of the crystalline oxide semiconductor 114 increases. Accordingly, the height of the crystalline oxide semiconductor 114 may be variously changed.

Subsequently, a gate insulation layer material may be deposited on the crystalline oxide semiconductor 114.

Subsequently, a gate material may be deposited on the gate insulation layer material.

Subsequently, by etching the gate insulation layer material and the gate material, as illustrated in FIG. 6, the gate insulation layer 117 and the gate 118 may be formed, and the first conductor 115 and the second conductor 116 may be formed.

Subsequently, the insulation layer may be deposited to cover the gate insulation layer 117 and the gate 118.

Subsequently, the first contact hole 122 exposing the first conductor 115 provided in the one end of the crystalline oxide semiconductor 114 and the second contact hole 123 exposing the second conductor 116 provided in the other end of the crystalline oxide semiconductor 114 may be formed in the insulation layer 119.

Finally, the first electrode 120 connected to the first conductor 115 through the first contact hole 122 and the second electrode 121 connected to the second conductor 116 through the second contact hole 123 may be formed on the insulation layer 119. Therefore, the oxide TFT according to an aspect of the present disclosure illustrated in FIG. 7 may be manufactured.

That is, through the above-described processes, an oxide TFT including the crystalline oxide semiconductor 114 having a thickness of 150 Å or more may be manufactured.

Figure 8:
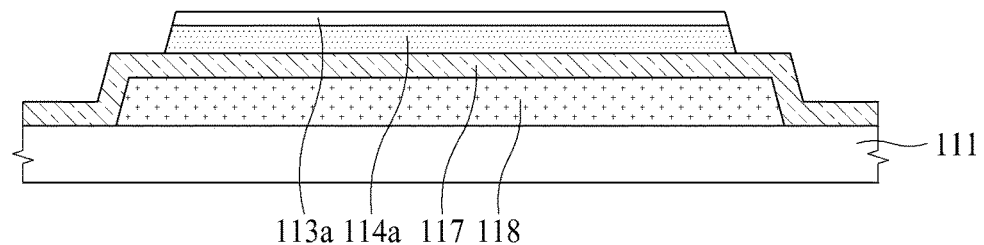
FIGS. 8 to 10 are other exemplary diagrams illustrating a method of manufacturing an oxide TFT according to an aspect of the present disclosure.
Figure 9:
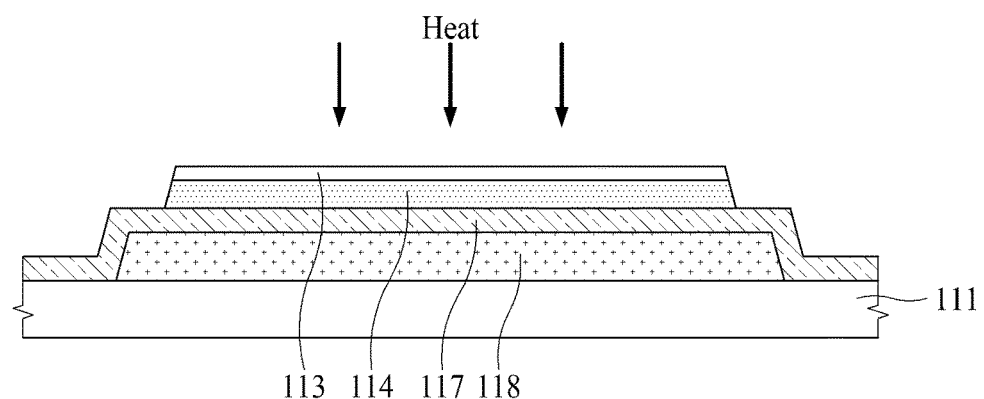
Figure 10:
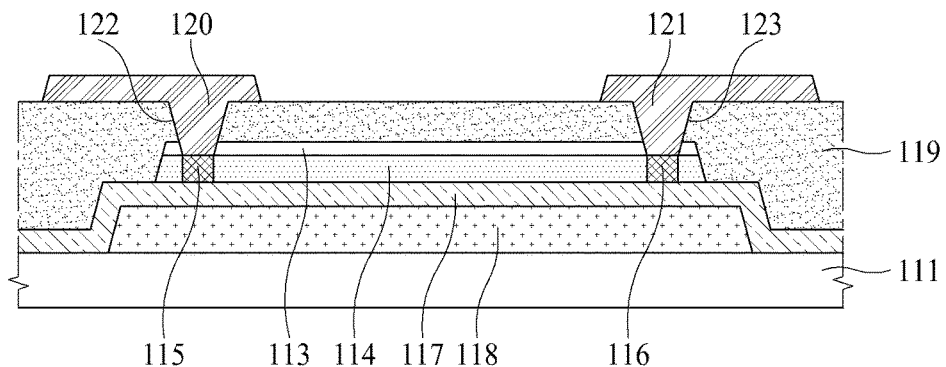

FIGS. 8 to 10 are other exemplary diagrams illustrating a method of manufacturing an oxide TFT according to an aspect of the present disclosure. In the following description, details which are the same as or similar to details described above with reference to FIGS. 1 to 4 are omitted or will be briefly described. Particularly, in the following description, elements which are the same as the elements described above with reference to FIGS. 1 to 7 are referred to by the same reference numerals used in FIGS. 1 to 7.

The oxide TFT according to an aspect of the present disclosure, as described above, may include a metal insulation layer 113 including metal, a crystalline oxide semiconductor 114 disposed on the metal insulation layer 113, a gate 118 including metal, a gate insulation layer 117 located between the crystalline oxide semiconductor 114 and the gate 118, a first conductor 115 disposed in one end of the crystalline oxide semiconductor 114, and a second conductor 116 disposed in the other end of the crystalline oxide semiconductor 114.

More specifically, in the oxide TFT according to an aspect of the present disclosure illustrated in FIG. 10, the gate 118 may be provided on a substrate 111, the gate insulation layer 117 may be provided on the gate 118, the crystalline oxide semiconductor 114 may be provided on the gate insulation layer 117, and the metal insulation layer 113 may be provided on the crystalline oxide semiconductor 114.

A method of manufacturing the oxide TFT having the above-described structure according to an aspect of the present disclosure will be described below.

First, as illustrated in FIG. 8, the gate 118 may be provided on the substrate 111, and the gate 118 may be covered by the gate insulation layer 117.

An amorphous oxide semiconductor 114a may be formed on the gate insulation layer 117 through an MOCVD process, and a metal 113a may be formed on the amorphous oxide semiconductor 114a.

Subsequently, as illustrated in FIG. 9, heat may be applied to the amorphous oxide semiconductor 114a and the metal 113a. Due to the heat, an oxidation-reduction reaction may be performed between the amorphous oxide semiconductor 114a and the metal 113a.

Due to the oxidation-reduction reaction, the metal 113a may be changed to the metal insulation layer 113, and the amorphous oxide semiconductor 114a may be changed to the crystalline oxide semiconductor 114 having directionality corresponding to one direction (for example, a direction parallel to a surface of the metal insulation layer 113).

Subsequently, the insulation layer 119 may be deposited to cover the crystalline oxide semiconductor 114, the metal insulation layer 113, and the gate insulation layer 117.

Subsequently, as illustrated in FIG. 10, a first contact hole 122 exposing the first conductor 115 provided on one side of the crystalline oxide semiconductor 114 and a second contact hole 123 exposing the second conductor 116 provided on the other side of the crystalline oxide semiconductor 114 may be formed in the insulation layer 119.

A portion of the metal insulation layer 113 may be etched by an etching process to form the first contact hole 122 and the second contact hole 123. Also, in the etching process of forming the first contact hole 122 and the second contact hole 123, a region of the crystalline oxide semiconductor 114 exposed by the first contact hole 122 and the second contact hole 123 may be exposed to plasma and/or the like, and thus, may become conductive. Therefore, as illustrated in FIG. 10, the first conductor 115 may be formed in a region, where the first contact hole 122 is formed, of the crystalline oxide semiconductor 114, and the second conductor 116 may be formed in another region, where the second contact hole 123 is formed, of the crystalline oxide semiconductor 114.

Finally, a first electrode 120 connected to the first conductor 115 through the first contact hole 122 and a second electrode 121 connected to the second conductor 116 through the second contact hole 123 may be formed on the insulation layer 119. Therefore, the oxide TFT according to an aspect of the present disclosure illustrated in FIG. 10 may be manufactured.

That is, through the above-described processes, an oxide TFT including the crystalline oxide semiconductor 114 having a thickness of 150 Å or less may be manufactured. A structure illustrated in FIG. 10 may be referred to as a bottom gate structure.

The oxide TFT according to an aspect of the present disclosure manufactured through the above-described process, as illustrated in FIG. 10, may include the gate 118 provided on the substrate 111, the gate insulation layer 117 covering the gate 118, the crystalline oxide semiconductor 114 provided on the gate insulation layer 117, the metal insulation layer 113 which is provided on the crystalline oxide semiconductor 114 and includes metal, the first conductor 115 provided on the one side of the crystalline oxide semiconductor 114, and the second conductor 116 provided on the other side of the crystalline oxide semiconductor 114.

Figure 11:
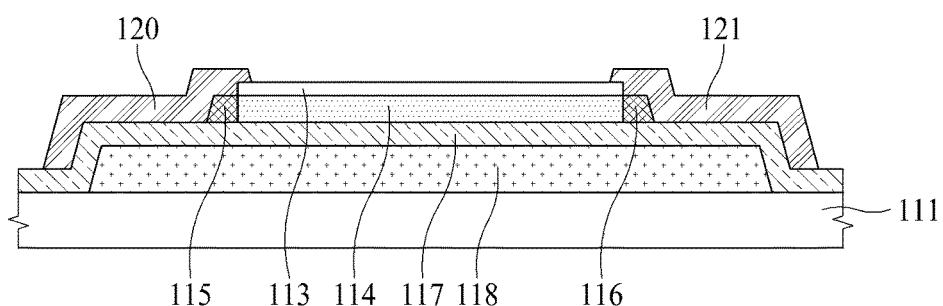
FIG. 11 is a cross-sectional view of an oxide TFT according to another aspect of the present disclosure.

FIG. 11 is a cross-sectional view of an oxide TFT according to another aspect of the present disclosure.

The oxide TFT according to another aspect of the present disclosure, as described above, may include a metal insulation layer 113 including metal, a crystalline oxide semiconductor 114 adjacent to the metal insulation layer 113, a gate 118 including metal, a gate insulation layer 117 provided between the crystalline oxide semiconductor 114 and the gate 118, a first conductor 115 provided in one end of the crystalline oxide semiconductor 114, and a second conductor 116 provided in the other end of the crystalline oxide semiconductor 114.

More specifically, in the oxide TFT according to an aspect of the present disclosure illustrated in FIG. 11, the gate 118 may be provided on a substrate 111, the gate insulation layer 117 may be provided on the gate 118, the crystalline oxide semiconductor 114 may be provided on the gate insulation layer 117, and the metal insulation layer 113 may be provided on the crystalline oxide semiconductor 114.

A method of manufacturing the oxide TFT having the above-described structure according to an aspect of the present disclosure will be described below.

The method of manufacturing the oxide TFT according to another aspect of the present disclosure is similar to the method of manufacturing the oxide TFT illustrated in FIG. 10.

For example, as illustrated in FIG. 9, when heat is applied to the amorphous oxide semiconductor 114a and the metal 113a, an oxidation-reduction reaction may be performed between the amorphous oxide semiconductor 114a and the metal 113a due to the heat. Due to the oxidation-reduction reaction, the metal 113a may be changed to the metal insulation layer 113, and the amorphous oxide semiconductor 114a may be changed to the crystalline oxide semiconductor 114 having directionality corresponding to one direction (for example, a direction parallel to a surface of the metal insulation layer 113). Subsequently, as illustrated in FIG. 10, the first electrode 120 may be connected to the first conductor 115 through the first contact hole 122, and the second electrode 121 may be connected to the second conductor 116 through the second contact hole 123.

However, in the oxide TFT illustrated in FIG. 11, a process of forming the first conductor 115 and the second conductor 116 may be performed after the process illustrated in FIG. 9.

For example, the metal insulation layer 113 provided in a region where the first conductor 115 and the second conductor 116 are to be formed may be etched by using a mask, and a region of the crystalline oxide semiconductor 114 exposed by the etching process may be exposed to plasma and/or the like, whereby the first conductor 115 and the second conductor 116 may be formed.

The first electrode 120 may be connected to the first conductor 115, and the second electrode 121 may be connected to the second conductor 116, whereby the oxide TFT illustrated in FIG. 11 may be manufactured.

Figure 12:
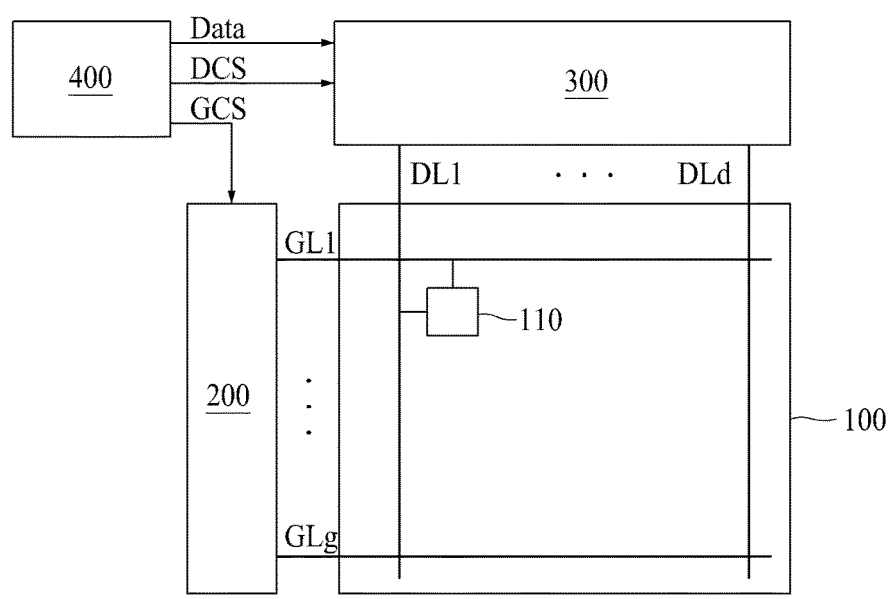
FIG. 12 is an exemplary diagram illustrating a configuration of a display device according to an aspect of the present disclosure.
Figure 13:
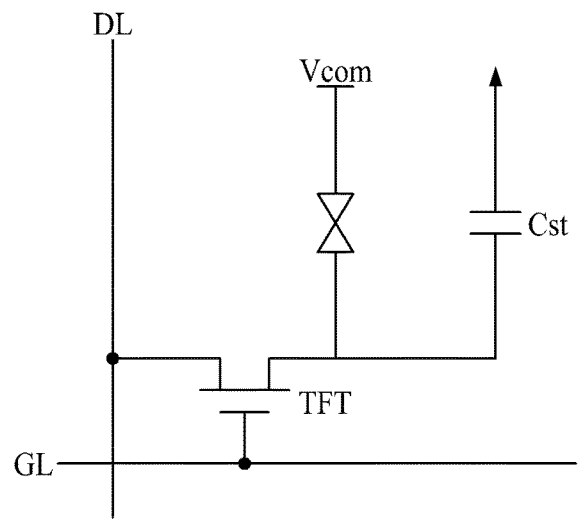
FIG. 13 is an exemplary diagram of a pixel included in a display panel according to an aspect of the present disclosure.
Figure 14:
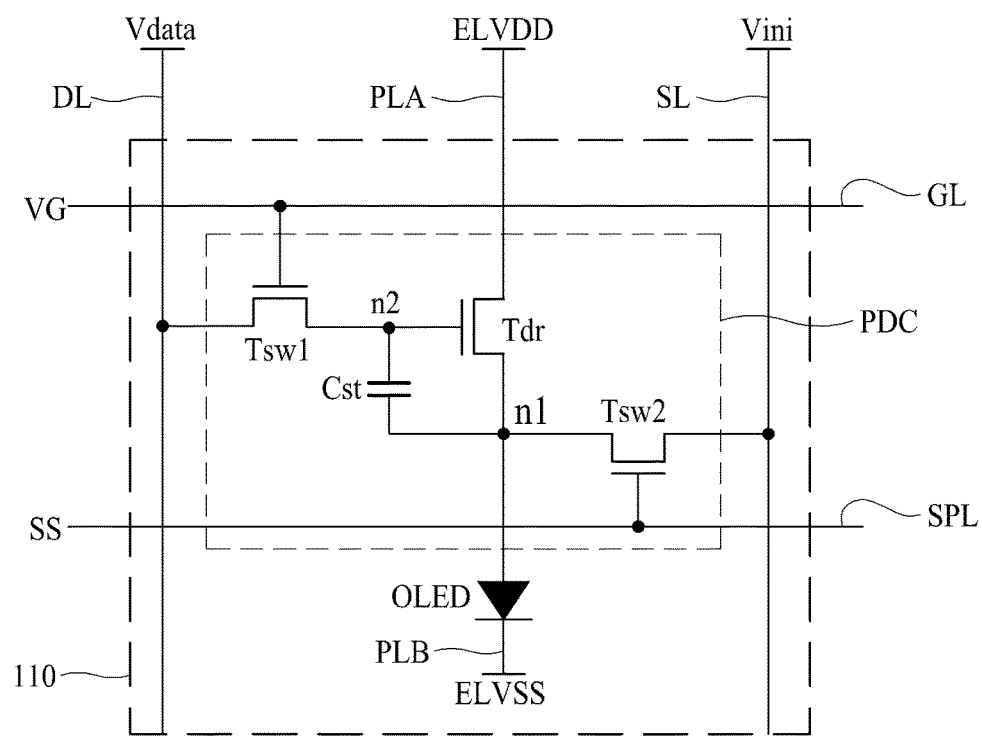
FIG. 14 is another exemplary diagram of a pixel included in a display panel according to an aspect of the present disclosure.

FIG. 12 is an exemplary diagram illustrating a configuration of a display device according to an aspect of the present disclosure. FIG. 13 is an exemplary diagram of a pixel included in a display panel according to an aspect of the present disclosure. FIG. 14 is another exemplary diagram of a pixel included in a display panel according to an aspect of the present disclosure.

The display device according to an aspect of the present disclosure, as illustrated in FIG. 12, may include a display panel 100 where a plurality of pixels 110 defined at the intersections of a plurality of gate lines GL1 to GLg and a plurality of data lines DL1 to DLd are provided to display an image, a gate driver 200 which sequentially supplies a gate pulse to the gate lines GL1 to GLg included in the display panel 100, a data driver 300 which respectively supplies data voltages to the data lines DL1 to DLd included in the display panel 100, and a controller 400 which controls the gate driver 200 and the data driver 300.

First, the display panel 100 may include the plurality of gate lines GL1 to GLg through which the gate pulse is supplied, the plurality of data lines DL1 to DLd through which the data voltages are respectively supplied, and the plurality of pixels 110 defined by intersections of the gate lines GL1 to GLg and the data lines DL1 to DLd, and each of the pixels 110 may include at least one oxide TFT according to an aspect of the present disclosure.

The display panel 100 may be a liquid crystal display panel applied to an LCD device, or may be an organic light emitting display panel applied to an organic light emitting display device.

If the display panel 100 is the liquid crystal display panel, each of the pixels 110 included in the display panel 100 may include one the oxide TFT used as a switching element for driving liquid crystal.

For example, in FIG. 13, one pixel of the liquid crystal display panel is illustrated. The one pixel may include an oxide thin film transistor TFT connected between a pixel electrode and a corresponding data line DL, according to an aspect of the present disclosure. A gate of the oxide thin film transistor TFT may be connected to a corresponding gate line GL.

A refractive index of the liquid crystal may be changed by a data voltage supplied to the pixel electrode and a common voltage Vcom supplied to a common electrode, and thus, a light transmittance of the liquid crystal may be changed, thereby brightness of light may be controlled by controlling the light transmittance. In this case, a storage capacitor Cst for holding the data voltage may be provided between the common electrode and the pixel electrode.

If the display panel 100 is an organic light emitting display panel, as illustrated in FIG. 14, each of the pixels 110 included in the display panel 100 may include an organic light emitting diode OELD emitting light and a pixel driver PDC for driving the organic light emitting diode OELD.

A plurality of signal lines DL, EL, GL, PLA, PLB, SL, and SPL for supplying a plurality of driving signals to the pixel driver PDC may be provided in each of the pixels 110.

The pixel driver PDC, for example, as illustrated in FIG. 14, may include a switching transistor Tsw1 connected to a gate line GL and a data line DL connected thereto, a driving transistor Tdr which controls a level of a current output to the organic light emitting diode OLED with a data voltage Vdata transferred through the switching transistor Tsw1, a sensing transistor Tsw2 which senses a characteristic of the driving transistor Tdr. A gate pulse and a gate low signal may be supplied to the gate line GL. A generic name for the gate pulse and the gate low signal may be a gate signal VG. A scan pulse and a scan low signal may be supplied to a scan pulse line SPL connected to a gate of the sensing transistor Tsw2. A generic name for the scan pulse and the scan low signal may be a scan control signal SS.

The switching transistor Tsw1, the driving transistor Tdr, and the sensing transistor Tsw2 may each be the above-described oxide TFT according to an aspect of the present disclosure.

The pixel driver PDC may further include other transistors in addition to the transistors, and each of the other transistors further included in the pixel driver PDC may be the oxide TFT according to an aspect of the present disclosure.

The controller 400 may output a gate control signal GCS for controlling the gate driver 200 and a data control signal DCS for controlling the data driver 300 by using a timing signal (for example, a vertical sync signal, a horizontal sync signal, and a clock) supplied from an external system. The controller 400 may sample input video data received from the external system, realign the input video data to generate digital image data Data, and supply the digital image data Data to the data driver 300.

The data driver 300 may convert the image data Data input from the controller 400 into analog data voltages Vdata and may transfer the data voltages Vdata for one horizontal line to the data lines DL1 to DLd at every one horizontal period in which the gate pulse is supplied to one gate line GL.

The gate driver 200 may sequentially supply the gate pulse to the gate lines GL1 to GLg of the display panel 100 in response to the gate control signal input from the controller 400. Therefore, an oxide TFT provided in each of the pixels 110 supplied with the gate pulse may be turned on, and the pixels 110 may display an image. The gate driver 200 may be provided independently from the display panel 100 and may be electrically connected to the display panel 100 in various types. For example, the gate driver 200 may be implemented as a gate in panel (GIP) type which is provided in the non-display area of the display panel 100.

As described above, according to the aspects of the present disclosure, an amorphous oxide semiconductor may be deposited on metal by the MOCVD process, and then, may be changed to a crystalline oxide semiconductor having directionality through the thermal treatment process.

Therefore, according to the aspects of the present disclosure, the reliability and mobility of the crystalline oxide semiconductor are enhanced, thereby enhancing the reliability and mobility of the oxide TFT, the display panel including the oxide TFT, and the display device including the display panel.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An oxide thin film transistor (TFT) comprising:
a metal insulation layer including metal;
a crystalline oxide semiconductor in close proximity to the metal insulation layer and converted from an amorphous oxide semiconductor;
a gate formed of metal;
a gate insulation layer between the crystalline oxide semiconductor and the gate;
a first conductor disposed at a first side of the crystalline oxide semiconductor;
a second conductor disposed at a second side of the crystalline oxide semiconductor; and
a supplemental crystalline oxide semiconductor directly crystallized and grown from the crystalline oxide semiconductor,
wherein the first and second conductors are converted from the crystalline oxide semiconductor and the supplemental crystalline oxide semiconductor, and
wherein the crystalline oxide semiconductor has a crystalline directionality originated from a surface of the metal insulation layer.

2. The oxide TFT of claim 1, wherein the metal insulation layer is disposed on a substrate, the crystalline oxide semiconductor is disposed on the metal insulation layer, the gate insulation layer is disposed on the crystalline oxide semiconductor, and the gate is disposed on the gate insulation layer.

3. The oxide TFT of claim 1, wherein the gate is disposed on a substrate, the gate insulation layer is disposed on the gate, the crystalline oxide semiconductor is disposed on the gate insulation layer, and the metal insulation layer is disposed on the crystalline oxide semiconductor.

4. The oxide TFT of claim 1, wherein the crystalline oxide semiconductor has directionality aligned in one direction.

5. The oxide TFT of claim 1, wherein the metal insulation layer includes at least one of aluminum (Al), titanium (Ti), chromium (Cr), nickel (Ni), and a Mo—Ti alloy (MoTi).

6. A display panel comprising:
a plurality of gate lines supplied with a gate pulse;
a plurality of data lines supplied with data voltages; and
a plurality of pixels defined at intersections of the plurality of gate lines and the plurality of data lines,
wherein each of the plurality of pixels each comprise at least one oxide TFT including a metal insulation layer including metal, a crystalline oxide semiconductor in close proximity to the metal insulation layer and converted from an amorphous oxide semiconductor, a gate formed of metal, a gate insulation layer between the crystalline oxide semiconductor and the gate, a first conductor disposed at a first side of the crystalline oxide semiconductor, a second conductor disposed at a second side of the crystalline oxide semiconductor, and a supplemental crystalline oxide semiconductor directly and grown from the crystalline oxide semiconductor,
wherein the first and second conductors are converted from the crystalline oxide semiconductor and the supplemental crystalline oxide semiconductor, and
wherein the crystalline oxide semiconductor has a crystalline directionality originated from a surface of the metal insulation layer.

7. The oxide TFT of claim 6, wherein the metal insulation layer is disposed on a substrate, the crystalline oxide semiconductor is disposed on the metal insulation layer, the gate insulation layer is disposed on the crystalline oxide semiconductor, and the gate is disposed on the gate insulation layer.

8. The oxide TFT of claim 6, wherein the gate is disposed on a substrate, the gate insulation layer is disposed on the gate, the crystalline oxide semiconductor is disposed on the gate insulation layer, and the metal insulation layer is disposed on the crystalline oxide semiconductor.

9. The oxide TFT of claim 6, wherein the crystalline oxide semiconductor has directionality aligned in one direction.

10. The oxide TFT of claim 6, wherein the metal insulation layer includes at least one of aluminum (Al), titanium (Ti), chromium (Cr), nickel (Ni), and a Mo—Ti alloy (MoTi).

11. A method of manufacturing an oxide thin film transistor (TFT), the method comprising:
sequentially forming a metal layer and an oxide semiconductor layer on a substrate;
applying heat to the metal layer and the oxide semiconductor layer having a non-crystalline structure to change the oxide semiconductor layer to a crystalline oxide semiconductor layer; and
connecting a first electrode and a second electrode to the crystalline oxide semiconductor layer,
wherein the connecting the first electrode and the second electrode includes connecting the first electrode to a first conductor disposed on one side of the crystalline oxide semiconductor and connecting the second electrode to a second conductor disposed on another side of the crystalline oxide semiconductor.

12. The method of claim 11, wherein the sequentially forming the metal layer and oxide semiconductor layer includes through a sputtering process and metal organic chemical vapor deposition (MOCVD) process, respectively.

13. The method of claim 11, wherein the connecting of the first electrode and the second electrode comprises:
forming a gate insulation layer material on the crystalline oxide semiconductor layer;
forming a gate material on the gate insulation layer material;
etching the gate insulation layer material and the gate material to form a gate insulation layer and a gate;
forming an insulation layer to cover the gate insulation layer and the gate;
forming a first contact hole exposing a portion of the first conductor at a first side of the crystalline oxide semiconductor and a second contact hole exposing a portion of the second conductor at a second side of the crystalline oxide semiconductor in the insulation layer; and
forming the first electrode connected to the first conductor through the first contact hole and the second electrode connected to the second conductor through the second contact hole, on the insulation layer.

14. The method of claim 11, wherein the forming the metal layer and the oxide semiconductor layer comprises:
forming a gate on a substrate;
forming a gate insulation layer to cover the gate;
forming the oxide semiconductor layer on the metal layer including the gate insulation layer through a metal organic chemical vapor deposition (MOCVD) process; and
forming the metal layer on the oxide semiconductor.

15. An oxide thin film transistor (TFT) comprising:
a metal insulation layer including metal;

a crystalline oxide semiconductor in contact with the metal insulation layer and having directionality aligned to one direction that is converted from an amorphous oxide semiconductor;

a gate of the oxide thin film transistor;

a gate insulation layer between the crystalline oxide semiconductor and the gate;

a first conductor in contact with a first side of the crystalline oxide semiconductor layer;

a second conductor in contact with a second side of the crystalline oxide semiconductor layer; and a supplemental crystalline oxide semiconductor directly crystallized and grown from the crystalline oxide semiconductor, wherein the first and second conductors are converted from the crystalline oxide semiconductor and the supplemental crystalline oxide semiconductor, and wherein the crystalline oxide semiconductor has a crystalline directionality originated from a surface of the metal insulation layer.

16. The oxide TFT of claim 15, wherein the crystalline oxide semiconductor layer has a thickness of at least 150 Å.

17. The oxide TFT of claim 15, wherein the crystalline oxide semiconductor layer has directionality aligned to a C-axis.

* * * * *